(12) United States Patent
Anderson

(10) Patent No.: US 10,256,780 B2
(45) Date of Patent: Apr. 9, 2019

(54) DUTY CYCLE CLIPPER

(71) Applicant: ICEpower a/s, Søborg (DK)

(72) Inventor: Kennet Skov Anderson, Søborg (DK)

(73) Assignee: ICEpower a/s, Søborg (DK)

( * ) Notice: Subject to any disclaimer, the term of this patent is extended or adjusted under 35 U.S.C. 154(b) by 0 days.

(21) Appl. No.: 15/556,449

(22) PCT Filed: Mar. 8, 2016

(86) PCT No.: PCT/EP2016/054893
§ 371 (c)(1),
(2) Date: Sep. 7, 2017

(87) PCT Pub. No.: WO2016/162156
PCT Pub. Date: Oct. 13, 2016

(65) Prior Publication Data
US 2018/0054173 A1 Feb. 22, 2018

(30) Foreign Application Priority Data

Apr. 9, 2015 (DK) .................................. 2015 00217

(51) Int. Cl.
*H03F 3/38* (2006.01)
*H03F 3/217* (2006.01)
(Continued)

(52) U.S. Cl.
CPC .......... *H03F 3/2173* (2013.01); *H03F 1/523* (2013.01); *H03F 3/181* (2013.01); *H03F 3/217* (2013.01);
(Continued)

(58) Field of Classification Search
CPC .................................. H03F 3/217; H03F 3/38
(Continued)

(56) References Cited

U.S. PATENT DOCUMENTS

| 4,600,891 A | 7/1986 | Taylor et al. |
| 4,724,396 A | 2/1988 | Taylor et al. |

(Continued)

FOREIGN PATENT DOCUMENTS

| EP | 1293038 | 3/2003 |
| WO | WO 2004/086616 | 10/2004 |

OTHER PUBLICATIONS

International Search Report and Written Opinion dated May 17, 2016 for PCT Application No. PCT/EP2016/054893 filed Mar. 8, 2016 (published as WO 2016/162156 on Oct. 13, 2016); 10 pages.

*Primary Examiner* — Steven J Mottola
(74) *Attorney, Agent, or Firm* — Harness, Dickey & Pierce, P.L.C.; Anthony G. Fussner

(57) ABSTRACT

A power conversion system comprising an amplifier input for receiving an analog input signal and an amplifier output for providing a switching output signal is disclosed. The system is applicable for use in high definition switching audio amplification. The power conversion system further comprises a clipper for clipping the analog input signal having a predefined range limited by a clipping level, a pulse modulator and a switching power stage. The system further has a feedback path to the clipper including a duty cycle measuring unit and a clip level filter which generates a clip level signal and where the clipping level of the clipper is controlled by the clip level signal. Hereby it is e.g. possible to clip an analog input signal with good precision and reliability in a switching power conversion system.

18 Claims, 7 Drawing Sheets

(51) Int. Cl.
*H03F 3/181* (2006.01)
*H03F 1/52* (2006.01)

(52) U.S. Cl.
CPC ....... *H03F 3/2175* (2013.01); *H03F 2200/03* (2013.01); *H03F 2200/66* (2013.01)

(58) Field of Classification Search
USPC .............................. 330/2, 10; 381/120, 121
See application file for complete search history.

(56) References Cited

U.S. PATENT DOCUMENTS

| | | |
|---|---|---|
| 7,315,202 B2 | 1/2008 | Tsuji |
| 2005/0083114 A1* | 4/2005 | Risbo ..................... H03F 3/217 330/10 |

\* cited by examiner

DUTY CYCLE CLIPPER

CROSS REFERENCE TO RELATED APPLICATIONS

This patent application is a U.S. national stage filing under 35 U.S.C. § 371 of International Application No. PCT/EP2016/054893 filed Mar. 8, 2016 (published as WO 2016/162156 on Oct. 13, 2016), which claims priority of Denmark Application No. PA 2015 00217 filed Apr. 9, 2015, and Denmark Application No. PA 2015 00539 filed Jun. 22, 2015. The disclosures of the applications identified in this paragraph are incorporated herein by reference in their entirety.

TECHNICAL FIELD OF THE INVENTION

This invention relates to the field of DC-DC and DC-AC power conversion, with particular relevance within high definition switching audio power amplification.

BACKGROUND

Switching audio amplifiers (class-D audio amplifiers) have found increasing use in the industry in recent years, both due to the improvements in output stage switching devices and in modulation and feedback control methods. The classical switching power amplifier system includes a pulse modulator, for converting an analog or digital source into a pulse-modulated signal which is subsequently amplified by a switching power stage. A passive demodulation filter reproduces an amplified input signal from the power modulated signal. Generally, class-D amplifiers are based on variants of Pulse Width Modulation (PWM).

For high output power at the output of a class-D audio amplifier it is desired to have a high clipping level at the input of the amplifier. However, a too high clipping level on the other hand will make the class-d amplifier stop switching. If the switch frequency is completely reduced in systems containing a boot strap voltage in the driver (power stage), the boot strap capacitor must be very large if a proper voltage is to be maintained while the amplifier is not switching. Further, if the class-D amplifier includes a feedback control system the control system can saturate if the clipping level is too high and the recovery from saturation can lead to undesired modifications of the output signal, such as, e.g. distortions.

In applications where a self oscillating control system is used for modulation of the class-D audio amplifier, the switch frequency will typically drop at high output levels. In order to minimize disturbance in the audio band it is desired not to have a switch frequency within the audio band (generally 20 Hz to 20 kHz). Furthermore at low switch frequencies the output ripple voltage can increase because the demodulation filter has less attenuation at lower frequencies, and this can lead to problems with EMI (electromagnetic interference) and undesired high frequency power dissipation in the speaker. Some self oscillating systems implement error functions when the duty cycle is higher or lower than a certain level, which can induce some undesired low frequency instability oscillation.

Therefore, clipping is considered to be an important aspect when designing class-D amplifiers for high quality audio perception.

There are some class-D amplifiers known from prior art which address the clipping aspect, an example of such an amplifier can be found in e.g. U.S. Pat. No. 7,965,141 which discloses a class-D amplifier comprising a clipping control unit that clips the output PWM-signal by limiting a digital input signal.

Further, U.S. Pat. No. 6,320,465 discloses a system that measures on the supply voltage and divides by the gain in the system to get the clipping level at the input signal that will give a desired duty cycle clipping level. Because of practical limitations in the division precision, the clipping level will have some variation. A system utilizing a division by a resistor divider is in general expensive and/or complex if a good precision of the resistor matching is to be achieved. Furthermore, the divider function will measure the supply voltage of the power stage, this will often be at a high voltage and the divider circuit can therefore not be implemented in a low voltage integrated circuit. The duty cycle for a certain output voltage will change with variation in the power stage and with demodulation filter impedance; therefore the divided clipping level will give un-precise duty cycle clipping level. Moreover, variations in the amplifier gain will also give an un-precise duty cycle clipping level.

Another prior art example can be found in U.S. Pat. No. 5,506,532. The amplifier assembly disclosed therein is limiting the duty cycle directly. However, such a system introduces problems with saturation of the control system when the duty cycle at the output is limited.

There is therefore a need for an improved power conversion system addressing the clipping aspect, in particular for high definition switching audio amplifiers.

SUMMARY OF THE INVENTION

It is therefore an object of the present invention to provide a power conversion system which alleviates all or at least some of the above-discussed drawbacks of the presently known systems.

This object is achieved by means of a power conversion system as defined in the appended claims.

According to an aspect of the invention there is provided a power conversion system comprising an amplifier input for receiving an analogue input signal, and an amplifier output for providing a switching output signal, the power conversion system comprising:
 a clipper for clipping the analogue input signal to provide a clipped input signal having a predefined range limited by a clipping level;
 a pulse modulator for modulating the clipped input signal to form a pulse width modulated (PWM) signal;
 a switching power stage for amplification of the PWM signal to form the switching output signal; and
 a feedback path to the clipper, which feedback path includes:
  a duty cycle measuring unit configured to measure a duty cycle of the PWM signal and generate a measurement signal; and
  a clip level filter configured to receive the measurement signal and provide a clipping voltage;
 wherein the clipping level of the clipper is controlled by the clipping voltage.

Such a power conversion system is capable of clipping an analogue input signal with good precision and reliability. The PWM signal can either be taken/measured from an output of the pulse modulator or from an output of the switching power stage. In controlled oscillation modulation (COM) applications the pulse modulator can include a comparator as known in the art, whereby the PWM signal can be taken from the output of the comparator.

The present invention is based on the realization that if one measures directly on the duty cycle of the PWM signal generated in the power conversion system, and uses this measurement to generate a clipping signal at the input, a very precise and stable system may be constructed. Additionally, by measuring the duty cycle of the PWM signal and subsequently clipping at the input of the system, the control system is kept in balance. Furthermore, the inventors found that by precisely limiting the duty cycle to a certain predefined level, rather than trying to keep the duty cycle as high as possible, the undesirable oscillations as discussed in the background section can be avoided.

In accordance with one exemplary embodiment wherein the duty cycle measuring unit comprises a low block and a high block each having the PWM signal as input, wherein each block is configured to measure if the duty cycle of the PWM signal is below or above a predefined threshold respectively, wherein each block comprises:

a first measurement current source configured to charge a measurement capacitor with a first measurement current during one of a high or low period of the PWM signal;

a second measurement current source configured to discharge the measurement capacitor with a second measurement current during the other one of a high or low period of the PWM signal;

wherein the first measurement current is a predefined ratio of the second current; and a measurement comparator configured to generate the measurement signal if a voltage across the measurement capacitor is above or below a predefined measurement threshold voltage.

This embodiment ensures good accuracy of the clipping system (more specifically, accurate measurements of the duty cycle of the PWM signal) and provides a versatile embodiment which may easily be realized in an integrated circuit implementation. In particular, by using two current sources with currents that differ by a predefined factor the clipping system can be made very precise. This is due to the fact that it is much more difficult to control absolute values of currents than it is to control a ratio between two currents. Moreover, since this factor may be controlled very precisely it allows the clipping system to measure a duty cycle very precisely which makes the system clip at a very precise duty cycle, in contrast to conventional systems using resistor dividers or the like as discussed in the background section of the present application.

According to another exemplary embodiment, the duty cycle measuring unit comprises a low block and a high block each having the PWM signal as input, wherein each block is configured to measure if the duty cycle of the PWM signal is below or above a predefined threshold respectively, wherein each block comprises:

a first measurement current source configured to continuously charge a measurement capacitor with a first measurement current;

a second measurement current source configured to discharge the measurement capacitor with a second measurement current during one of a high or low period of the PWM signal;

wherein the first measurement current is a predefined ratio of the second current; and a measurement comparator configured to generate the measurement signal if a voltage across the measurement capacitor is below a predefined measurement threshold voltage.

In this embodiment, the charging current (i.e. first measurement current) is continuously running, thus the need for switching the charging current on and off is diminished, which simplifies the circuit control and reduces costs. It may furthermore be difficult to realize accurate switching in some practical implementations. It goes without saying that the functions of the two current sources can be interchanged (the discharging current is e.g. continuously running) and appropriate adjustments made, i.e. resulting in that the measurement comparator will generate a measurement signal if a voltage across the measurement capacitor is above a predefined threshold, without departing from the scope of the invention.

In another exemplary embodiment the clip level filter comprises:

a first clip filter current source configured to charge a clip filter capacitor with a first clip filter current during one of a high or low period of the measurement signal;

a second clip filter current source configured to discharge the clip filter capacitor with a second clip filter current during the other one of a high or low period of the measurement signal;

wherein a voltage across the clip filter capacitor is used as the clipping voltage.

This clipping voltage is then accordingly used to control the clipping level of the clipper. Similarly to the different embodiments discussed above, the charging current (first clip filter current) may be continuously running in another exemplary embodiment of the invention, in order to simplify the topology and reduce costs of the system.

BRIEF DESCRIPTION OF THE DRAWINGS

For exemplifying purposes, the invention will be described in closer detail in the following with reference to embodiments thereof illustrated in the attached drawings, wherein.

DETAILED DESCRIPTION

In the following detailed description, some embodiments of the present invention will be described. However, it is to be understood that features of the different embodiments are exchangeable between the embodiments and may be combined in different ways, unless anything else is specifically indicated. Even though in the following description, numerous specific details are set forth to provide a more thorough understanding of the present invention, it will be apparent to one skilled in the art that the present invention may be practiced without these specific details. In other instances, well known constructions or functions are not described in detail, so as not to obscure the present invention. In the following various signals will be referred to as high or low, which is common terminology in the field of signal processing and are to be understood as the two parts/portions of a period of a PWM pulse, e.g. a period of a PWM pulse having a duty cycle of 50% will have a high portion and a low portion of substantially equal width, and a duty cycle of 100 means that the signal is high for the whole period. The term modulation depth is considered to correspond to indicate how much the signal varies around its un-modulated level, i.e. a modulation depth of 0 corresponds to a duty cycle of 50%, while a modulation depth of 1 corresponds to a duty cycle of 0 or 100%. Modulation depth (M) relates to the duty cycle (d) according to $M=|(d-½)*2)|$. The inventive clipping system is useful in systems with constant switch frequency and in systems with variable switch frequency such as self-oscillating systems.

Figure 1:
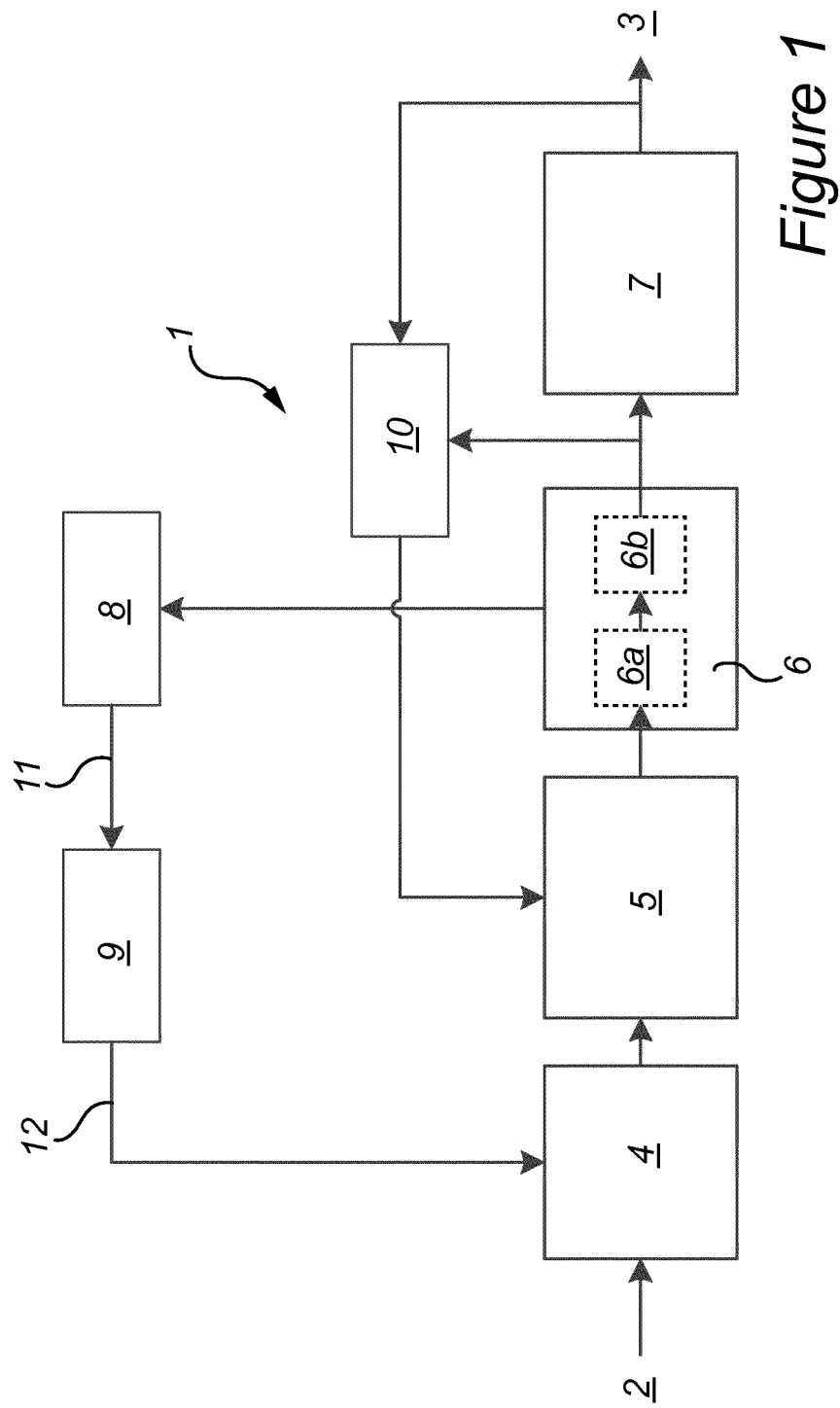
FIG. 1 is a block diagram representation of a switching power conversion system in accordance with an embodiment of the present invention.

FIG. 1 illustrates a switching power conversion system 1 in accordance with an embodiment of the invention where an analogue input 2 is clipped using feedback from a feedback loop from a duty cycle measurement. The switching power conversion system 1 may for example be used in an audio amplifier assembly. The input 2 then being an analogue audio signal and the output 3 being an amplified analogue audio signal.

The system 1 includes a clipping arrangement comprising a clipper 4 at the analogue input 2, a feedback path from a switching power stage 6 to the clipper 4, where the signal path includes a duty cycle measuring unit 8. The duty cycle measuring unit 8 is configured to measure a duty cycle of an output signal (a PWM signal) from a pulse modulator, such as e.g. from the output of a pulse modulator 6a (e.g. output of a comparator in a COM-system) in the switching power stage 6. From the output signal of the pulse modulator 6a in the switching power stage 6, the duty cycle measuring unit 8 generates one or more measurement signal(s) 11. The measurement signal(s) 11 indicates that a duty cycle at the output of the comparator 6a is too high or too low. Next, a clip level filter 9 receives the measurement signal(s) at an input and outputs a clipping voltage 12. The clipping voltage can be either positive or negative depending on the clip level filter; however a clipping voltage magnitude 12 may generally be used. This clipping voltage (magnitude) 12 is subsequently received at an input of the clipper 4, and the clipper 4 is configured to limit the analogue input signal in accordance with a clipping level (which depends on the clipping voltage 12). A lower clipping voltage magnitude generated/provided by the clip level filter results in a lower clipping level (i.e. the analogue input signal is clipped to a higher extent or alternatively the analogue input signal is more limited).

The switching power conversion system 1 can further include a compensator 5, feedback signals and feedback filters (represented by the feedback block 10) for suppressing errors in the switching power stage 6 and the demodulation filter 7, and also to ensure self-oscillating conditions in COM-systems. The duty cycle is, as mentioned, measured at the output PWM (output of the pulse modulator 6a). However, in alternative implementations/embodiments the duty cycle of the output PWM can be measured at the output of the driver stage 6b, however the components used at the measuring block must be accordingly adjusted to withstand the higher voltage levels. The duty cycle level is compared to a threshold to find out if the duty cycle is too high or too low (i.e. if the modulation depth is too high). If the duty cycle is too high or too low the duty cycle measuring block 8 together with the clip level filter 9 can lower the clipping level of the input signal until the duty cycle is not too high or too low (i.e. at an acceptable level). Similarly, the clipping level of the input signal can be increased if the duty cycle is not too high or too low.

Some exemplary embodiments are described below with reference to the relevant figures.

Figure 2:
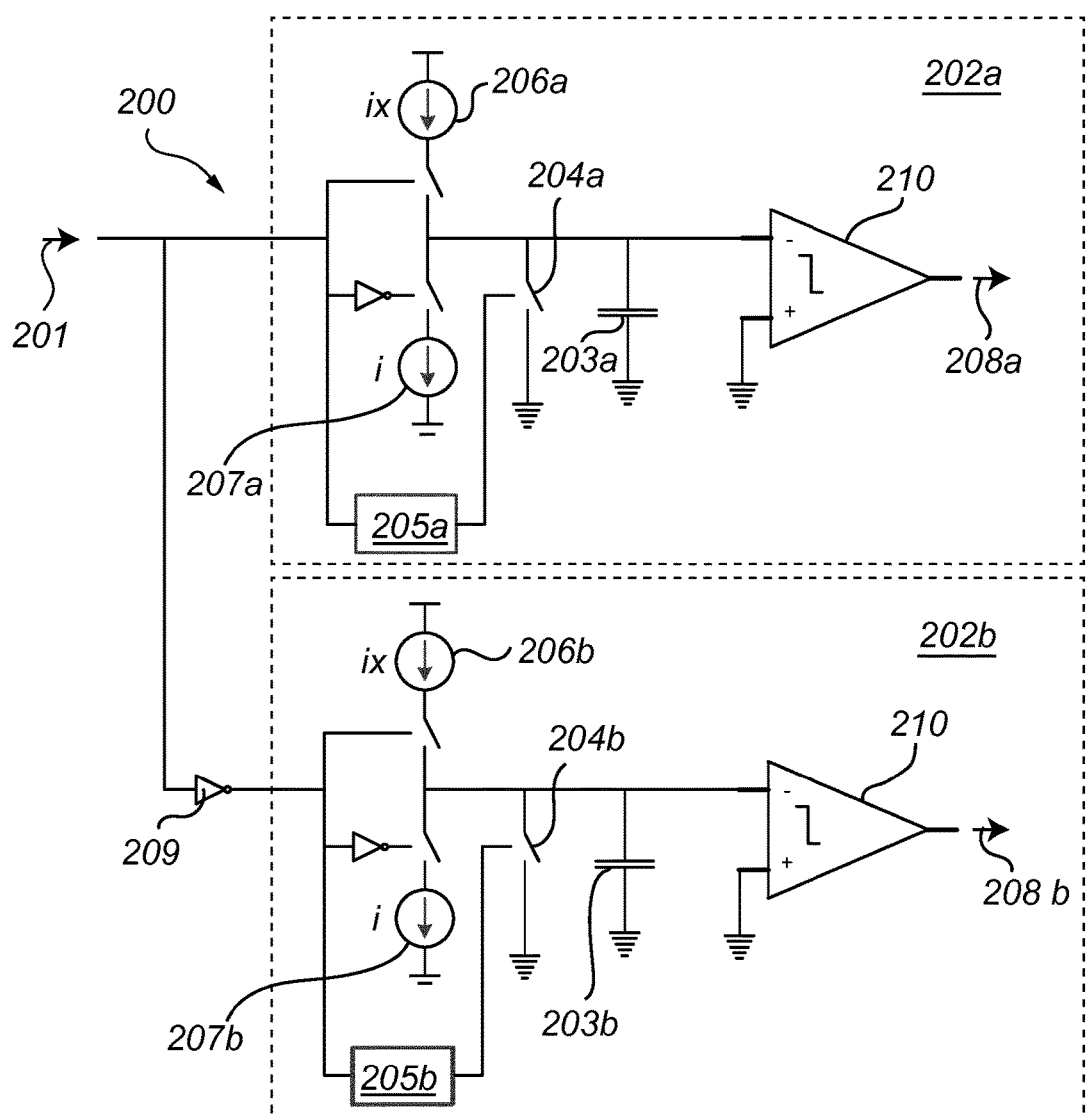
FIG. 2 shows a schematic drawing of a duty cycle measuring unit in accordance with an embodiment of the present invention.

FIG. 2 displays a schematic circuit of an embodiment of the duty cycle measure block 200 (8 in FIG. 1). The top block 202a (or sometimes called low side 202a) is configured to analyze if the duty cycle of the input (PWM) signal 201 is too low, i.e. if the time the PWM signal 201 is low is too long compared to the time the previous pulse was high. At the rising edge of the input signal 201 (the input signal 201 being generated by a pulse modulator in a switching power stage) a capacitor 203a is set to an initial value of 0V. The capacitor 203a is set to the initial value of 0V by means of a switch 204a and a rising edge detection unit 205a which closes the switch 204a when a rising edge in the input signal 201 is detected, which consequently short circuits the capacitor 203a.

Further, when the input signal 201 is high the capacitor 203a is charged with a first current (i*x) by means of a first current source 206a, and when the input signal is low the capacitor 203a is discharged with a second current (i) by means of a second current source 207a. The second current being a predefined ratio/proportion of the first current, as indicated by the factor x. If the voltage across the capacitor 203a becomes lower than 0V (i.e. negative) the duty cycle of the input signal 201 is determined to be too low and the output signal 208a (measurement signal) from the top block 202a will be high as long as the voltage across the capacitor 203a is lower than 0V. In this particular embodiment the comparators 210 are referenced to ground, however they can also be referenced to a voltage in other embodiments.

The top block 202a allows for very precise control of a minimum duty cycle level threshold value, and by increasing the charge current (i*x) (first current) relative to the discharge current (i) (second current), the lower the minimum duty cycle threshold value will be.

For example, in a very simple case if the factor x is chosen to be 4, i.e. the first current is four times the magnitude of the second current, the duty cycle of the input signal 201 must be above approximately 20%, otherwise the top side 202a will produce a (high) signal at the output 208a, which indicates that the duty cycle is too low (or at least below 20%).

Further, the bottom side 202b (or sometimes called the high side) of the block is configured to analyze if the duty cycle of the input signal 201 is too high. The bottom side 202b operates in an analogous manner as the top side but with an inverted input signal, as indicated by the inverter 209. In more detail, it can be said that the output signal 208a of the top side 202a will be high/positive if the duty cycle of the input signal 201 is too low, and the output signal 208b of the bottom side 202b will be high/positive if the duty cycle of the input signal 201 is too high. Where, too high/too low is relative to a predefined value which is effectively controlled by controlling the ratio between the charging current (first current) and discharging current (second current), i.e. controlling the factor x.

The factor x can be the same in both the top block 202a and the bottom block 202b in order to provide symmetrical duty cycle limits, e.g. if x is chosen to be 4 at both of the charging current sources 206a, 206b the duty cycle measurement block indicates if the duty cycle goes below or above 20% and 80% respectively. The factor x could be chosen to be e.g. 3 or 5, then the duty cycle thresholds would be 25%, 75% and 16.7%, 83.3%, respectively, and so on.

Furthermore the functionality of the top and bottom block may be interchanged by adjusting the ratios of the charging and discharging currents and the circuit 200 may be configured so that the comparators generate an output 208a-b when the voltage across the capacitor 203a-b is above a predefined threshold voltage by having a set of falling edge detection units instead of the rising edge detection units 205a-b and adjusting the current sources 206a-b, 207a-b accordingly. Moreover, the charging current sources 206a-b may be configured to charge during a low period and the discharging current sources 207a-b may be configured to discharge during a high period of the input signal. Such and other obvious modifications are considered to fall within the protective scope as defined in the appended claims.

Figure 3:
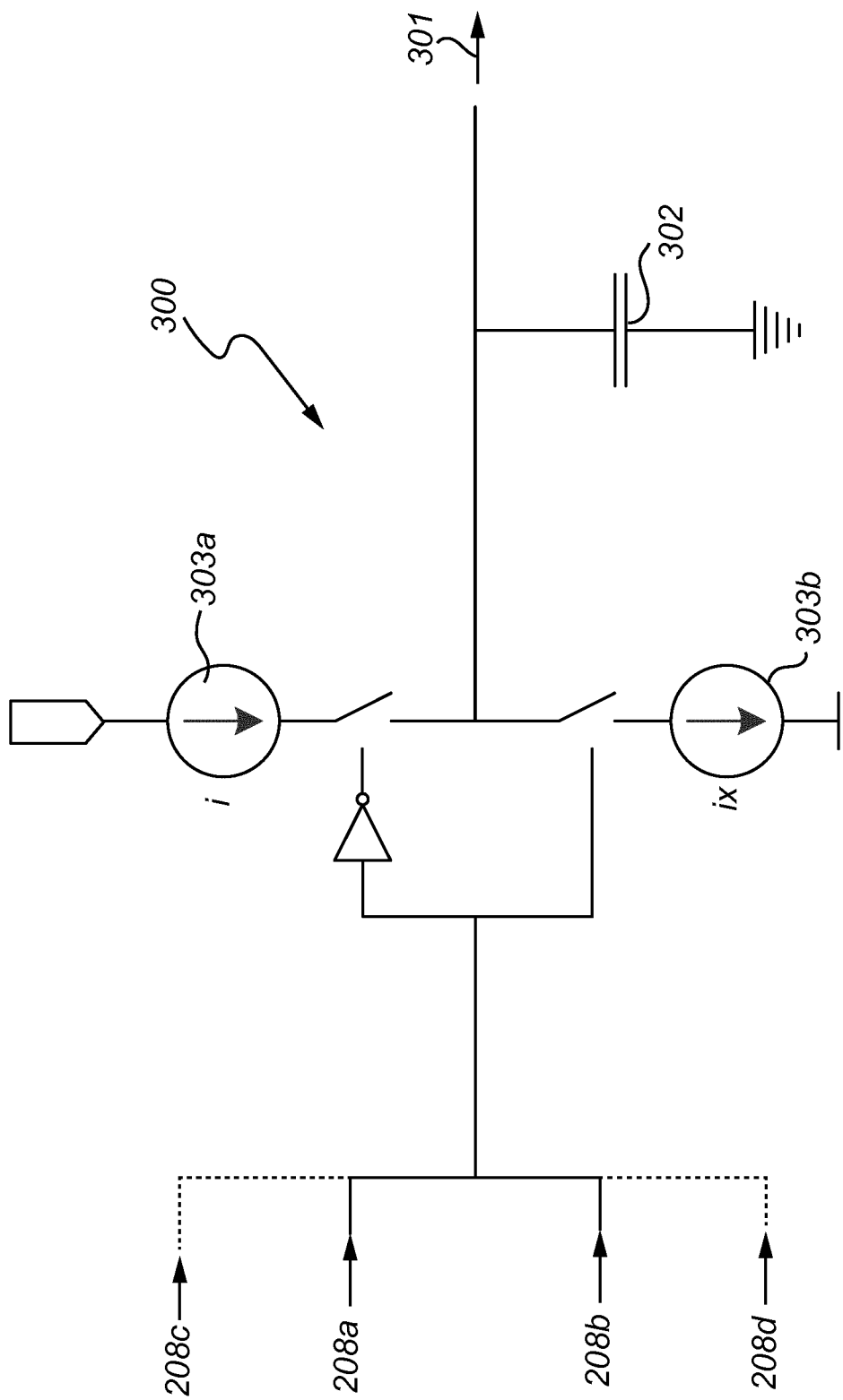
FIG. 3 illustrates a first order clip level filter in accordance with an embodiment of the present invention.

FIG. 3 shows a schematic circuit representation of an exemplary embodiment of a first order clip level filter 300 (9 in FIG. 1). The filter receives the two signals 208a, 208b from the duty cycle measure block (200 in FIG. 2) at an input. The filter 300 can also be utilized in systems having more than one channel as indicated by the additional inputs 208c-d. The operation of the clip level filter is in some ways similar to the operation of the two blocks in the duty cycle measuring unit (202a, 202b in FIG. 2) as there are clip filter current sources 303a-b which are charging and discharging a clip filter capacitor 302. A voltage across a capacitor 302 is used to control a clipping level of a signal applied at an amplifier input (2 in FIG. 1). When the duty cycle measuring unit (e.g. 200 in FIG. 2) does not detect or measure a too high or too low duty cycle the two output signals (208a, 208b) from the duty cycle measuring unit are low and the capacitor 302 is charged with a first current (i) by means of a first current source 303a. Continuingly, when any one of the two input signals 208a, 208b is high the capacitor 302 is discharged with a second current (ix) by means of a second current source 303b, which lowers the voltage over the capacitor 302 and consequently the clipping voltage (at amplifier power conversion system input) can be lowered. Typically the factor x which indicates the ratio between the currents of the two current sources is chosen to be 1. However, depending on the intended applications the factor x can be chosen to be higher or lower than 1, in order to e.g. more rapidly increase/decrease the clipping level voltage at the input (may be referred to as the filter's attack and release characteristics).

Furthermore, in this particular embodiment where x is chosen to be 1, i.e. the currents of the two clip filter current sources 303a, 303b are substantially of equal magnitude, will result in that: in order to change the clipping voltage 301 either one of the input signals 208a-d need to have a duty cycle of more than 50%. Thus, if the duty cycle measure block 200 as discussed with reference to FIG. 2 is configured to indicate if the duty cycle of an input PWM signal (201 in FIG. 2) is below or above 20% and 80% respectively, the resulting output 301 from the clip level filter 300 will maintain the duty cycle of the input PWM signal above or below 10% and 90% respectively.

Figure 4:
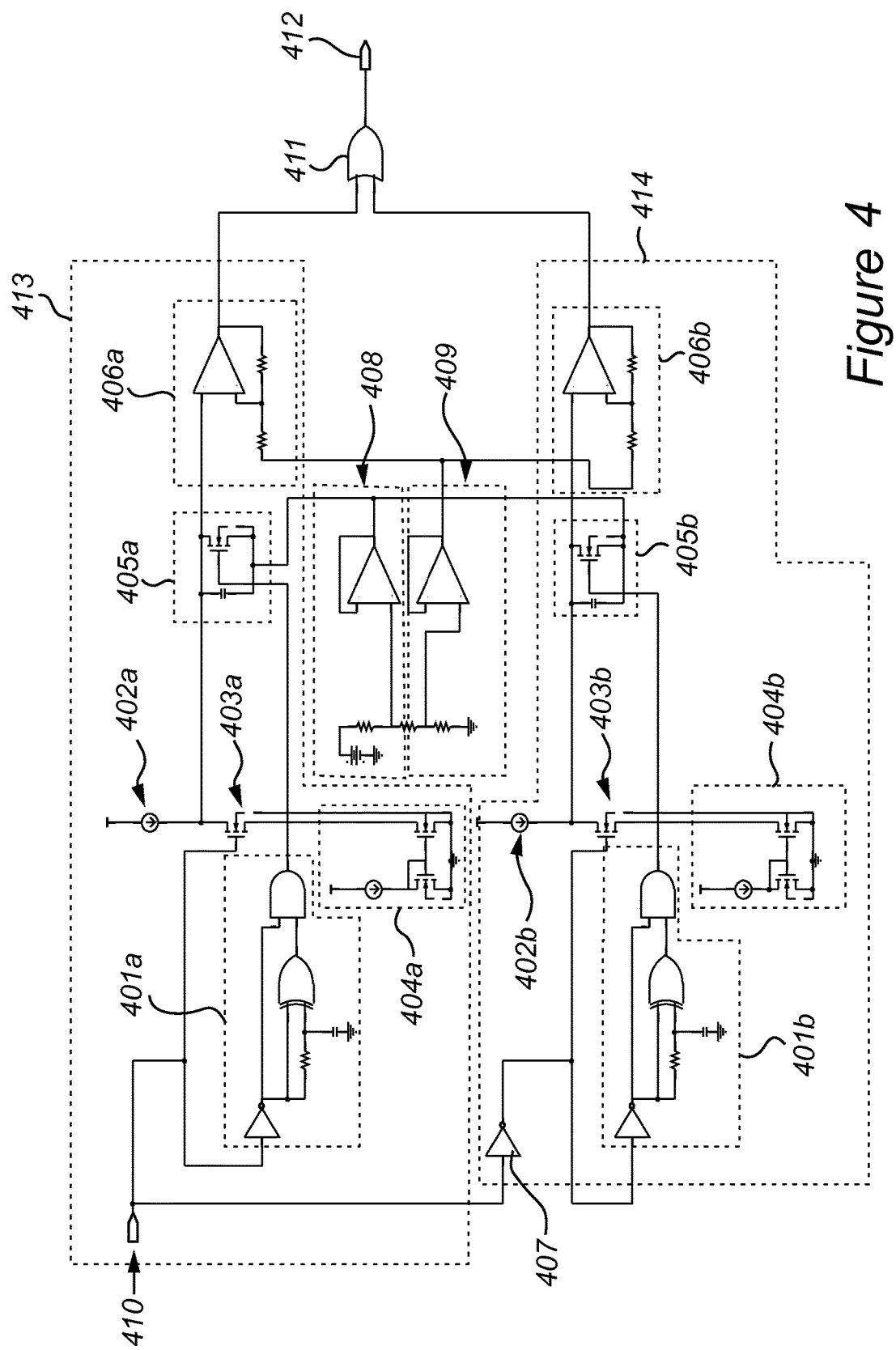
FIG. 4 illustrates a schematic drawing of a duty cycle measuring unit in accordance with another embodiment of the present invention.

FIG. 4 is a circuit diagram of a duty cycle measuring unit in accordance with an exemplary embodiment of the invention. The circuit has been divided into separate section in order to facilitate the understanding of the functionality. Section 413 is configured to analyze if the duty cycle of the input 410 is too high. Section 414 is configured to analyze if the duty cycle of the input 410 is too low by inverting the input with the inverter 407. The outputs from the duty cycle high measure 413 and the duty cycle low measure 414 are combined with a gate 411 to the output 412, in order to produce a common measurement signal indicative of that the duty cycle is too high or too low. The circuit serves to show that the duty cycle clip level can be adjusted by controlling a factor between the charging current (first measurement current), which is generated by the first current generator/source 402a and 402b and the discharging current (second measurement current, which is generated by the second current generator/source 404a and 404b. Here the charging current is always running and the discharging current is switched in with a switch 403a and 403b. Since the charge current is always running the discharging current must be larger to get a net discharging current. The blocks 401a and 401b are constructing a short pulse at a "falling edge" in order to short circuit the capacitor in 405a and 405b. When shorting the capacitors in 405a and 405b, which is used for measuring the duty cycle of an input signal, it is initialized to a voltage (output of 408) higher than the voltage (output of 409) for the comparator (406a and 406b) in order to increase robustness and thereby allow for some tolerances in the comparator offset voltage.

Figure 5:
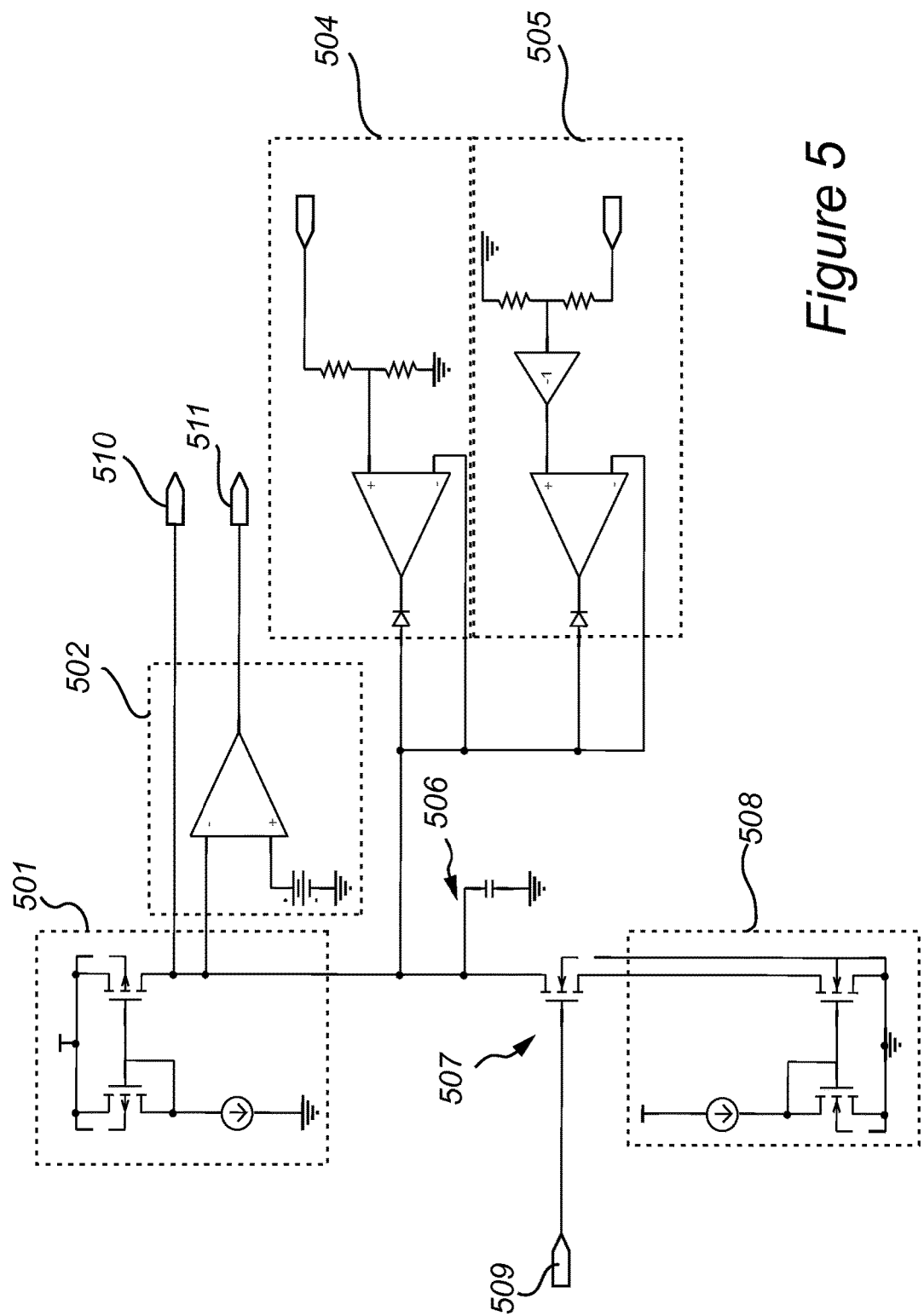
FIG. 5 illustrates a schematic drawing of a first order clip level filter in accordance with another embodiment of the present invention.

FIG. 5 illustrates a circuit diagram of a first order clip level filter in accordance with an embodiment of the invention. The filter attack and release can be adjusted by controlling a factor which determines a ratio between the charging current (first clip filter current), generated by first clip filter current source 501, and the discharging current (second clip filter current) generated by the second clip filter current source 508. For example, the discharging current may be chosen to be two times the charging current, if the charging current is always (i.e. continuously) running then the discharging current must be two times the charging current if the net charge of the clip filter capacitor 506 is to correspond to the scenario described earlier where the charging/discharging currents were the same but the charging current was only switched in for a certain time within a period of a PWM signal. Further, the clip filter capacitor 506 can be pre-charged to the clip level set by the power supply rails; typically the pre-charge level is a level that is slightly higher than the clip level that the duty cycle clipper will produce/give. The release time is controlled by the charging current from the first clip filter current source 501 and the capacitor 506; the attack time is controlled by the capacitor 506 and a net discharging current (i.e. the discharging current minus the charging current that is always running). The input 509 is controlling the switch 507 which "switches in" the discharging current. The initial clip voltage 510 can be set by a factor of the positive supply voltage 504 or by a factor of the negative supply voltage 505. In order to monitor if the duty cycle clipper is saturated (if the clipping system is saturated), a comparator (in section 502) is measuring if the duty cycle clipper level is lower than a predefined level and generating an output 511.

Figure 6:
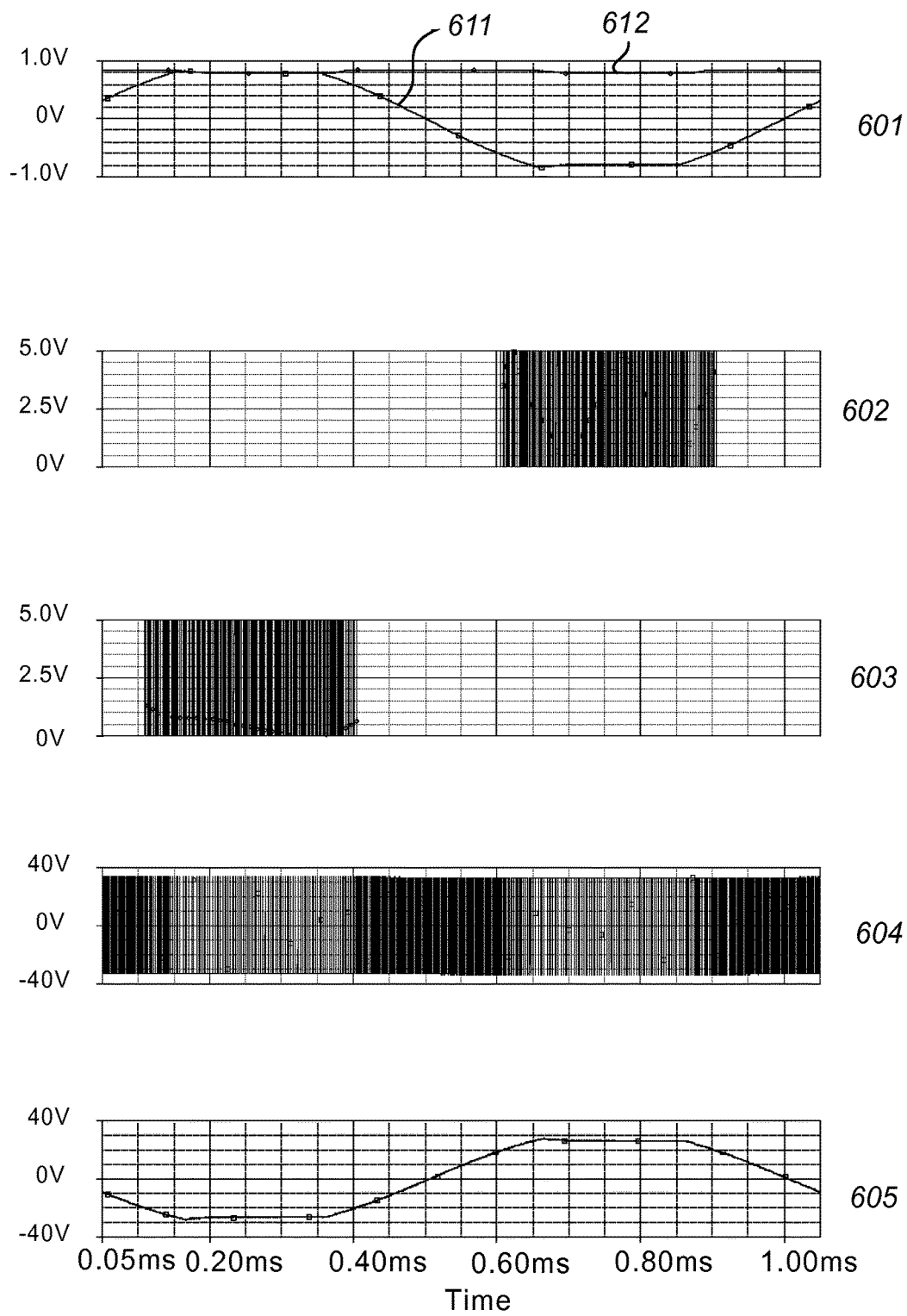
FIG. 6 illustrates simulation results of a duty cycle clipper with a clip filter in accordance with the embodiments illustrated in FIG. 4 and FIG. 5.

FIG. 6 illustrates a set of graphs which are simulation results of a duty cycle clipper with a first order clip filter. The top plot/graph 601 (top in reference to the figure orientation) shows an input signal 611 of the power conversion system and a clipping signal 612. The clipping signal being the signal that is outputted by the clip level filter 9 in FIG. 1. The second graph from the top 602 illustrates a signal that indicates that the duty cycle of an output PWM signal (illustrated in 604) is higher than a predefined threshold value. The middle graph 603 illustrates the corresponding signal that indicates that the duty cycle of the output PWM signal (illustrated in 604) is lower than a threshold value. The fourth graph 604 from the top is the PWM output signal, and the bottom graph 605 is the output signal of the audio amplifier assembly/switching power conversion system after the demodulation filter (e.g. 7 in FIG. 1).

Figure 7:
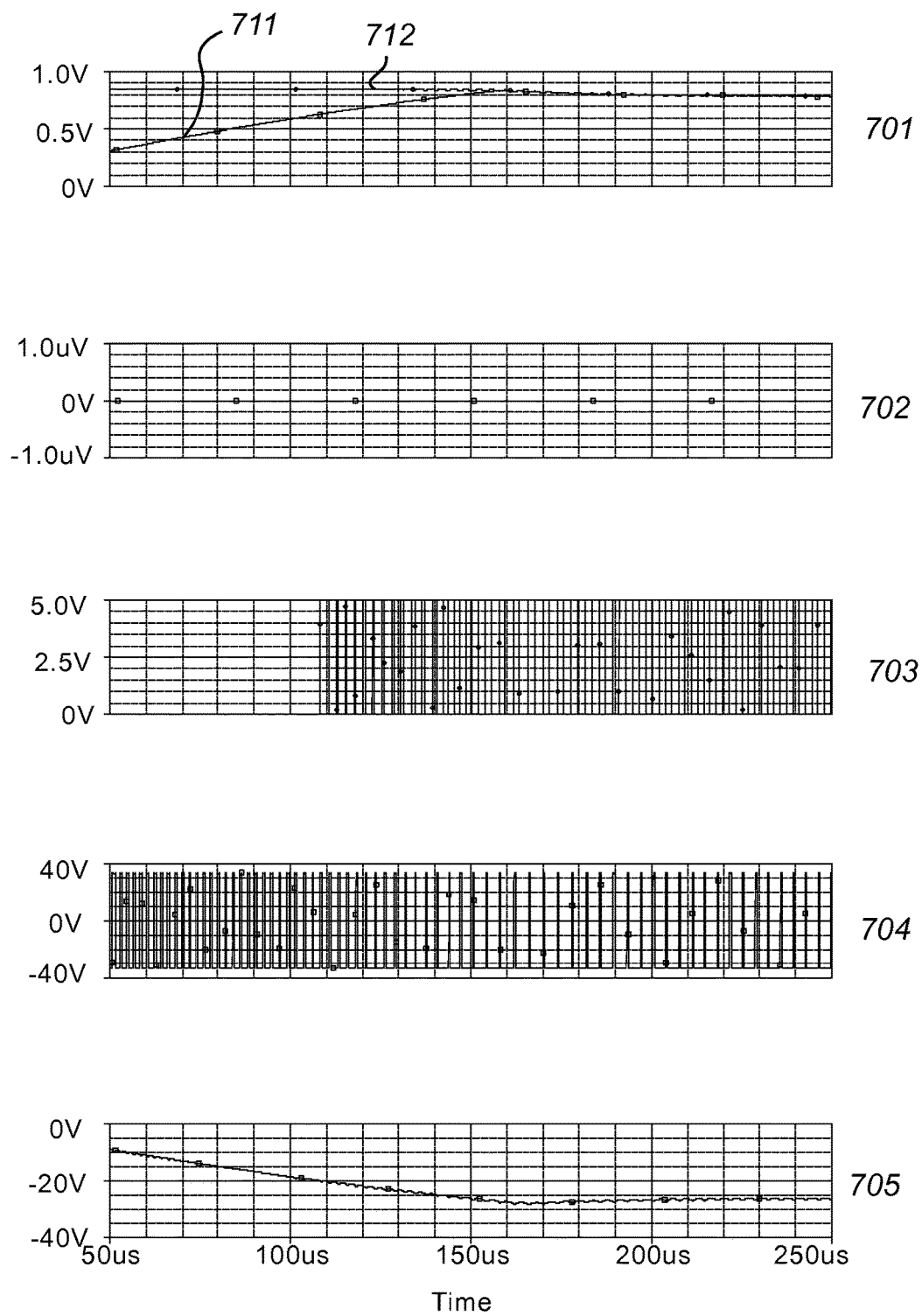
FIG. 7 illustrates a more detailed display of the simulation results presented in FIG. 6.

FIG. 7 is a zoomed in-view of the simulation plots/graphs in FIG. 6 in order to further elucidate the inventive concept. The graphs are arranged in the same order as in FIG. 6 where the top graph is the amplifier input signal and the clipping signal and the bottom graph is the amplifier output signal. In this particular embodiment it can be seen that the clipping signal 712 is lowered when one of the blocks in the duty cycle measuring unit (plot 702 and 703) generates an output which indicates that the duty cycle of the output PWM signal is above/below a threshold value. In this particular example/implementation the signal in 703, that is indicating that the duty cycle is below the predefined threshold, needs to have a duty cycle above 50% itself, i.e. it has a high density more than 50% of the time in the beginning of the clipping in order to lower the clipping level. This is controlled by controlling the charging current/discharging current ratio in the clip level filter, in this example it is using the same current for charge and discharge of the capacitor at the clip signal. This can be seen since the clipping signal in the top graph is not lowered until the duty cycle of the signal in 703 is above 50%. The graph 702 shows the signal indicative of that the duty cycle of the PWM signal in 704 is above a predefined threshold and the bottom graph 705 shows the resulting output from an audio amplifier assembly comprising a system according to the invention.

The clipping system according to the present invention can be implemented in various applications/systems as exemplified below, either in full or partly as components. The clipping system can accordingly be used systems where a single ended input signal is clipped and/or be used with systems where a balanced input signal is clipped. Further the clipping system can be implemented as a signal loop comprising a first order filter from duty cycle measurement to clipper, a higher order filter from duty cycle measurement to clipper or a multi step filter from duty cycle measurement to clipper.

The person skilled in the art realizes that the present invention by no means is limited to the preferred embodiments described above. On the contrary, many modifications and variations are possible within the scope of the appended claims. For example, there may be embodiments, where the clip level filter is combined for two channels, or for more than two channels.

Furthermore, the invention is useful in single ended amplifiers, BTL (Bridge Tied Load) dual supply, BTL single supply, or where two control systems are synchronized, or with only a single control system. Additional functional features are, adjustable duty cycle measure circuit, for level adjustment, adjustable duty cycle measure circuit by analog DC-voltage, adjustable duty cycle measure circuit by I2C (Inter-integrated circuit).

The invention claimed is:

1. A power conversion system comprising:
    an amplifier input for receiving an analogue input signal;
    an amplifier output for providing a switching output signal;
    a clipper for clipping the analogue input signal to provide a clipped input signal having a predefined range limited by a clipping level;
    a pulse modulator for modulating the clipped input signal to form a pulse width modulated (PWM) signal;
    a switching power stage for amplification of the PWM signal to form the switching output signal; and
    a feedback path to said clipper, which feedback path includes:
        a duty cycle measuring unit configured to measure a duty cycle of the PWM signal and generate a measurement signal indicative of the duty cycle; and
        a clip level filter configured to receive said measurement signal and provide a clipping voltage;
    wherein the clipper is connected to receive the clipping voltage and configured to adjust the clipping level based on the clipping voltage.

2. The power conversion system according to claim 1, wherein said feedback path is from an output of said pulse modulator.

3. The power conversion system according to claim 1, wherein said feedback path is from an output of said power stage.

4. The power conversion system according to claim 1, wherein said duty cycle measuring unit comprises a low block and a high block each having said PWM signal as input, wherein each block is configured to measure if the duty cycle of said PWM signal is below or above a predefined threshold respectively, wherein each block comprises:
    a first measurement current source configured to charge a measurement capacitor with a first measurement current during one of a high or low period of said PWM signal;
    a second measurement current source configured to discharge said measurement capacitor with a second measurement current during the other one of a high or low period of said PWM signal;
    wherein said first measurement current is a predefined ratio of said second current; and
    a measurement comparator configured to generate said measurement signal if a voltage across said measurement capacitor is above or below a predefined measurement threshold voltage.

5. The power conversion system according to claim 1, wherein said duty cycle measuring unit comprises a low block and a high block each having said PWM signal as input, wherein each block is configured to measure if the duty cycle of said PWM signal is below or above a predefined threshold respectively, wherein each block comprises:
    a first measurement current source configured to continuously charge a measurement capacitor with a first measurement current;
    a second measurement current source configured to discharge said measurement capacitor with a second measurement current during one of a high or low period of said PWM signal;
    wherein said first measurement current is a predefined ratio of said second current; and
    a measurement comparator configured to generate said measurement signal if a voltage across said measurement capacitor is below a predefined measurement threshold voltage.

6. The power conversion system according to claim 1, wherein said clip level filter comprises:
    a first clip filter current source configured to charge a clip filter capacitor with a first clip filter current during one of a high or low period of said measurement signal;
    a second clip filter current source configured to discharge said clip filter capacitor with a second clip filter current during the other one of a high or low period of said measurement signal;
    wherein a voltage across said clip filter capacitor is used as said clipping voltage.

7. The power conversion system according to claim 1, wherein said clip level filter comprises:
- a first clip filter current source configured to continuously charge a clip filter capacitor with a first clip filter current;
- a second clip filter current source configured to discharge said clip filter capacitor with a second clip filter current during one of a high or low period of said measurement signal;
- wherein a voltage across said clip filter capacitor is used as said clipping voltage.

8. The power conversion system according to claim 6, wherein said first clip filter current is a predefined ratio of said second clip filter current.

9. The power conversion system according to claim 6, wherein said clip level filter is configured to receive measurement signals from a plurality of channels.

10. The power conversion system according to claim 1, wherein the analogue input signal is an audio signal.

11. The power conversion system according to claim 10, further comprising a demodulation filter in order to demodulate the switching output signal from said switching power stage to form an amplified audio signal.

12. The power conversion system according to claim 11 wherein said feedback path is a first feedback path, and wherein said power conversion system further comprises:
- a compensator between said clipper and said pulse modulator; and
- a second feedback path applied from an output of the demodulation filter to said compensator.

13. The power conversion system according to claim 12, further comprising a third feedback path from an output of the switching power stage to said compensator.

14. A method for power conversion comprising the steps of:
- receiving an analogue input signal;
- clipping the analogue input signal to provide a clipped input signal having a predefined range limited by a clipping level;
- modulating the clipped input signal to form a pulse width modulated (PWM) signal;
- amplifying the PWM signal to form a switching output signal;
- measuring a duty cycle of the PWM signal and generate a measurement signal indicative of said duty cycle; and
- filtering the measurement signal to provide a clipping voltage;
- wherein the step of clipping the analogue input signal is based on said clipping voltage.

15. The method according to claim 14, wherein the step of measuring a duty cycle of the PWM signal includes:
- charging a measurement capacitor with a first measurement current during one of a high or low period of said PWM signal;
- discharging said measurement capacitor with a second measurement current during the other one of a high or low period of said PWM signal;
- wherein said first measurement current is a predefined ratio of said second current; and
- generating said measurement signal if a voltage across said measurement capacitor is above or below a predefined measurement threshold voltage.

16. The method according to claim 14, wherein the step of measuring a duty cycle of the PWM signal includes:
- continuously charging a measurement capacitor with a first measurement current;
- discharging said measurement capacitor with a second measurement current during one of a high or low period of said PWM signal;
- wherein said first measurement current is a predefined ratio of said second current; and
- generating said measurement signal if a voltage across said measurement capacitor is below a predefined measurement threshold voltage.

17. The method according to claim 14, wherein the step of filtering comprises:
- charging a clip filter capacitor with a first clip filter current during one of a high or low period of said measurement signal;
- discharging said clip filter capacitor with a second clip filter current during the other one of a high or low period of said measurement signal;
- wherein a voltage across said clip filter capacitor is used as said clipping voltage.

18. The method according to claim 14, wherein the step of filtering comprises:
- continuously charging a clip filter capacitor with a first clip filter current;
- discharging said clip filter capacitor with a second clip filter current during one of a high or low period of said measurement signal;
- wherein a voltage across said clip filter capacitor is used as said clipping voltage.

* * * * *